(12) United States Patent
Srivastava et al.

(10) Patent No.: US 11,018,687 B1
(45) Date of Patent: May 25, 2021

(54) POWER-EFFICIENT COMPUTE-IN-MEMORY ANALOG-TO-DIGITAL CONVERTERS

(71) Applicant: QUALCOMM Incorporated, San Diego, CA (US)

(72) Inventors: Ankit Srivastava, San Diego, CA (US); Seyed Arash Mirhaj, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/931,337

(22) Filed: May 13, 2020

(51) Int. Cl.
*H03M 1/12* (2006.01)
*H03M 1/80* (2006.01)
*H03M 1/46* (2006.01)
*G06F 9/38* (2018.01)
*H03M 1/00* (2006.01)
*G06F 9/448* (2018.01)
*H03M 1/78* (2006.01)

(52) U.S. Cl.
CPC .......... *H03M 1/804* (2013.01); *G06F 9/3893* (2013.01); *G06F 9/4488* (2018.02); *H03M 1/002* (2013.01); *H03M 1/1225* (2013.01); *H03M 1/462* (2013.01); *H03M 1/78* (2013.01)

(58) Field of Classification Search
CPC ...... G01S 7/03; G01S 13/931; G01S 2013/93275; H01Q 9/0407; H01Q 15/14; H01Q 21/06; H03M 1/802; H03M 1/804; H03M 1/806

USPC .................................. 341/50, 51, 172
See application file for complete search history.

(56) References Cited

U.S. PATENT DOCUMENTS

| | | | | |
|---|---|---|---|---|
| 7,313,049 | B2 * | 12/2007 | Huang | G11C 7/1051 365/207 |
| 9,111,623 | B1 * | 8/2015 | Jung | G11C 11/1693 |
| 9,711,196 | B2 * | 7/2017 | Bartling | G11C 7/22 |
| 9,852,783 | B1 * | 12/2017 | Na | G11C 7/08 |
| 10,049,728 | B2 * | 8/2018 | Kim | G11C 11/419 |
| 10,236,053 | B1 * | 3/2019 | Ramaraju | G11C 7/08 |
| 10,825,510 | B2 * | 11/2020 | Jaiswal | G11C 8/16 |
| 2007/0115739 | A1 * | 5/2007 | Huang | G11C 7/12 365/203 |
| 2013/0336066 | A1 * | 12/2013 | Tercariol | H03F 3/082 365/185.18 |
| 2015/0228322 | A1 * | 8/2015 | Jung | G11C 7/08 365/158 |
| 2019/0042199 | A1 * | 2/2019 | Sumbul | G11C 11/4091 |
| 2019/0139595 | A1 * | 5/2019 | Ramaraju | G11C 7/065 |
| 2019/0385657 | A1 * | 12/2019 | Augustine | G11C 11/38 |

* cited by examiner

*Primary Examiner* — Jean B Jeanglaude
(74) *Attorney, Agent, or Firm* — Haynes and Boone, LLP

(57) ABSTRACT

A time-multiplexed group of MAC circuits for a machine learning application is provided in which at least one MAC circuit in the time-multiplexed group also functions as a capacitive-digital-to-analog converter (CDAC) within a successive approximation analog-to-digital converter (ADC). A comparator in the ADC is shared by the time-multiplexed group of MAC circuits.

29 Claims, 12 Drawing Sheets

POWER-EFFICIENT COMPUTE-IN-MEMORY ANALOG-TO-DIGITAL CONVERTERS

TECHNICAL FIELD

This application relates to compute-in-memories, and more particularly to power-efficient analog-to-digital converters for compute-in-memory applications

BACKGROUND

Computer processing of data typically uses a Von Neumann architecture in which the data is retrieved from a memory to be processed in an arithmetic-and-logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with a first aspect of the disclosure, a system for a machine learning application is provided that includes: a first multiply-and-accumulate (MAC) circuit including a first plurality of compute-in-memory bitcells configured to multiply a first plurality of stored weights with an input vector to provide a series of first MAC output voltages during a first calculation phase, the first MAC circuit also being configured to provide a first reference voltage during a first capacitive-digital-to-analog converter (CDAC) phase; a second MAC circuit including a second plurality of compute-in-memory bitcells configured to multiply a second plurality of stored weights with the input vector to provide a series of second MAC output voltages during a second calculation phase, the second MAC circuit also being configured to provide a second reference voltage during a second CDAC phase; a sequential accumulator configured to accumulate the series of first MAC output voltages to provide a first final MAC output voltage and to accumulate the series of second MAC output voltages to provide a second final MAC output voltage; a first multiplexer configured to select between the first final MAC output voltage and the second final MAC output voltage to provide a selected output voltage; and a comparator configured to compare the selected output voltage to the first reference voltage during the first CDAC phase and to compare the selected output voltage to the second reference voltage during the second CDAC phase to provide a digital output for the system.

In accordance with a second aspect of the disclosure, a system for a machine learning application is provided that includes: a first multiply-and-accumulate (MAC) circuit including a first plurality of compute-in-memory bitcells configured to multiply a first plurality of stored weights with an input vector to provide a series of first MAC output voltages during a first calculation phase; a second MAC circuit including a second plurality of compute-in-memory bitcells configured to multiply a second plurality of stored weights with the input vector to provide a series of second MAC output voltages during a second calculation phase, the second MAC circuit also being configured to provide a reference voltage during a first CDAC phase for the first MAC circuit and during a second CDAC phase for the second MAC circuit; a sequential accumulator configured to accumulate the series of first MAC output voltages to provide a first final MAC output voltage and to accumulate the series of second MAC output voltages to provide a second final MAC output voltage; a first multiplexer configured to select between the first final MAC output voltage and the second final MAC output voltage to provide a selected output voltage; and a comparator configured to compare the selected output voltage to the reference voltage during the first CDAC phase and to compare the selected output voltage to the reference voltage during the second CDAC phase to provide a digital output for the system.

In accordance with a third aspect of the disclosure, a system for a machine learning application is provided that includes: a read bit line; a first compute-in-memory bitcell having a first output node; and a second compute-in-memory bitcell including: a second output node; an output capacitor having a first plate connected to the first output node and the second output node and having a second plate connected to the read bit line; a first transistor connected between the second plate and ground; and a second transistor connected between the second plate and a power supply node for a power supply voltage.

In accordance with a fourth aspect of the disclosure, a multiply-and-accumulate (MAC) circuit for a machine learning application is provided that includes: a read bit line; a first compute-in-memory bitcell including a first output capacitor having a first plate connected to the read bit line and having a second plate; a second compute-in-memory bitcell including a second output capacitor having a first plate connected to the read bit line and having a second plate; and a transmission gate connected between the second plate of the first output capacitor and the second plate of the second output capacitor.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To increase processing speeds in machine learning applications, compute-in-memory bitcells not only store filter weights but also function to multiply their stored filter weights with input bits from an input vector. The compute-in-memory (CiM) bitcells are organized to form a layer of neurons that process the input vector from a previous layer or from input data such as an image to be analyzed by the machine learning application. Within a convolutional layer, a collection of compute-in-memory bitcells that are organized into a compute-in-memory (CiM) multiply-and-accumulate (MAC) circuit are designated herein as a filter. The output of the CiM MAC circuit represents the multiplication of the stored filter weight bits with the corresponding input bits for the filter. For example, suppose the filter has the dimensions of 2 by 2 by 2. There are thus eight filter weights in such a filter that are multiplied by the corresponding input samples. The resulting CiM MAC circuit performs eight multiplications and accumulates them to form a MAC output voltage that is digitized in an analog-to-digital converter (ADC) to provide an output signal that is propagated to the next layer.

The following discussion will be directed to machine learning applications in which the MAC circuits are analog MAC circuits that produce an analog output voltage representing the result of the multiply-and-accumulate operation. An analog MAC circuit will be referred to simply herein as a MAC circuit. The MAC circuits within a layer perform a matrix multiplication of the stored filter weights with the input vector. For example, each filter may be formed from a column of CiM bitcells. An analog-to-digital converter (ADC) converts the analog voltage into a digital output for the neuron implemented by the filter.

Figure 1:
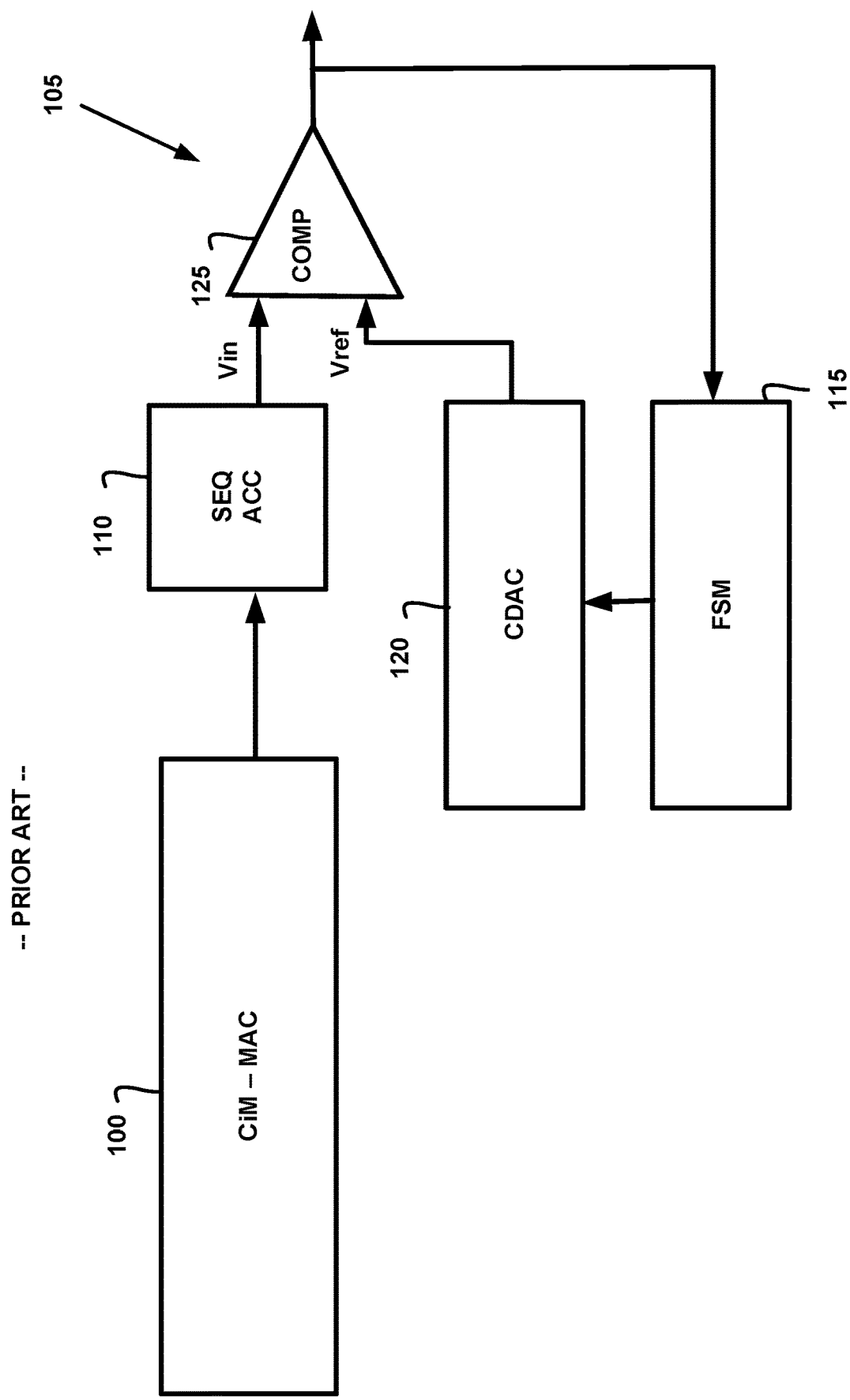
FIG. 1 illustrates a conventional compute-in-memory MAC circuit and an ADC including a CDAC that is separate from the compute-in-memory MAC circuit.

The ADC may be a successive approximation ADC that includes a capacitive digital-to-analog converter (CDAC). A neuron for a convolutional layer in a machine learning application may thus be formed as shown in FIG. 1 by a MAC circuit 100 that drives a successive approximation ADC 105 that includes a CDAC 120 as shown in FIG. 1. Note that each sample of an input vector to MAC circuit 100 may be a multi-bit input sample. To multiply such a multi-bit input sample with a corresponding binary filter weight, a sequential accumulator (SEQ ACC) 110 includes a plurality of binary-weighted capacitors. For example, MAC circuit 100 produces a first output voltage that represents the multiplication of the binary filter weights with the most-significant bit of the input vector samples. Sequential accumulator 110 samples this first output voltage on a first capacitor (not illustrated). Similarly, MAC circuit 100 then produces a second output voltage that represents the multiplication of the binary filter weights with the next-most-significant bit of the input vector samples. Sequential accumulator 110 samples this second output voltage on a second capacitor (not illustrated) that has the appropriate binary weighting as compared to the first capacitor. In this fashion, MAC circuit 100 continues to produce output voltages that are sampled on corresponding capacitors in sequential accumulator 110 until all the bits in the multi-bit input samples are processed. Sequential accumulator 110 then shorts together the capacitors to produce a final output voltage (Vin) that represents the multiplication of the binary filter weights with the corresponding multi-bit input samples.

Should the filter weights themselves be multi-bit filter weights, MAC circuit 100 includes a column of bitcells for each bit in the multi-bit filter weights. The resulting multiplication of these filter weight bits then proceeds as discussed above for the binary filter weights. Sequential accumulator 110 again functions to properly sample the output voltages from the various columns of bitcells in MAC circuit 100 and sum the resulting sampled output voltages to produce the final MAC output voltage Vin. In ADC 105, a comparator 125 then compares the final MAC output voltage to a reference voltage (Vref) produced CDAC 120. For example, the initial reference voltage may be one-half the power supply voltage (VDD/2). Should this initial comparison indicate that the final MAC output voltage Vin is greater than VDD/2, a first bit in a digital output from ADC 105 is set. To calculate the remaining bits in the digital output, a logic circuit such as a finite state machine (FSM) 115 functions to control CDAC 120 to increase (or decrease) the reference voltage in a binary fashion as necessary. For example, if the initial comparison by comparator 125 indicates the final MAC output voltage was less than VDD/2, FSM 115 may control CDAC to reduce the reference voltage to VDD/4 for a subsequent comparison. Alternatively, if the initial comparison indicates that the final MAC output voltage was greater than VDD/2, FSM 115 may control CDAC 120 to increase the reference voltage to ¾*VDD. In this fashion, FSM 115 controls CDAC 120 in a binary fashion to determine all the bits for the digitization of the Vin voltage.

Figure 2:
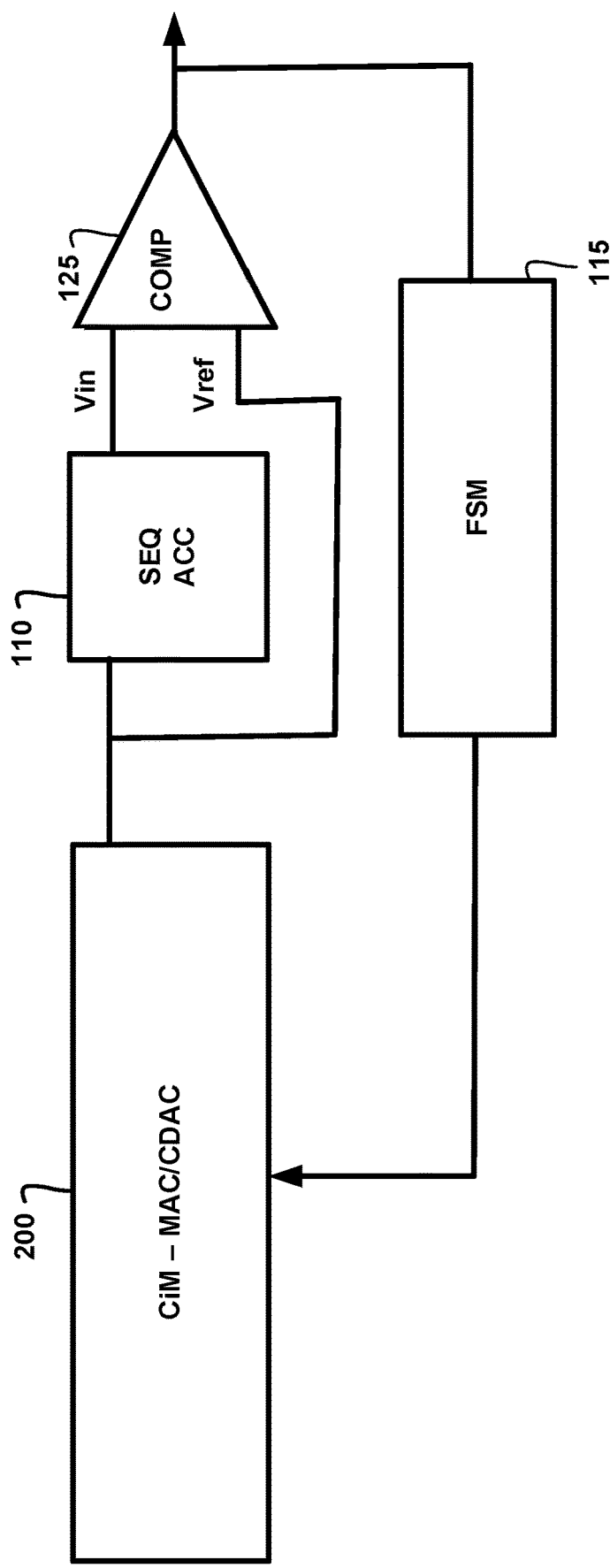
FIG. 2 illustrates a compute-in-memory (CiM) MAC circuit having an integrated CDAC in accordance with an aspect of the disclosure.

CDAC 120 requires a substantial amount of die space and is thus a major factor in limiting density. To improve density, a compute-in-memory bitcell is disclosed herein having an output capacitor that also functions as a CDAC capacitor. During a calculation phase, the output capacitor is charged according to the multiplication of the stored binary filter weight and the corresponding input bit. The charge from the various output capacitors is accumulated on a read bit line to produce an output voltage for the MAC circuit that is sampled by a sequential accumulator (in embodiments in which the input vector samples are multi-bit samples). The output capacitor is then repurposed to function as a CDAC capacitor during the digitization of the MAC output voltage. The resulting MAC circuit is thus also a CDAC to advantageously increase density of the resulting machine learning implementation. An example MAC circuit/CDAC 200 is shown in FIG. 2. Sequential accumulator 110, comparator 125, and FSM 115 function analogously as discussed for MAC circuit 100. During a digitization phase of the final MAC output voltage Vin, FSM 115 controls MAC circuit/CDAC 200 to produce the desired reference voltage Vin.

Figure 3:
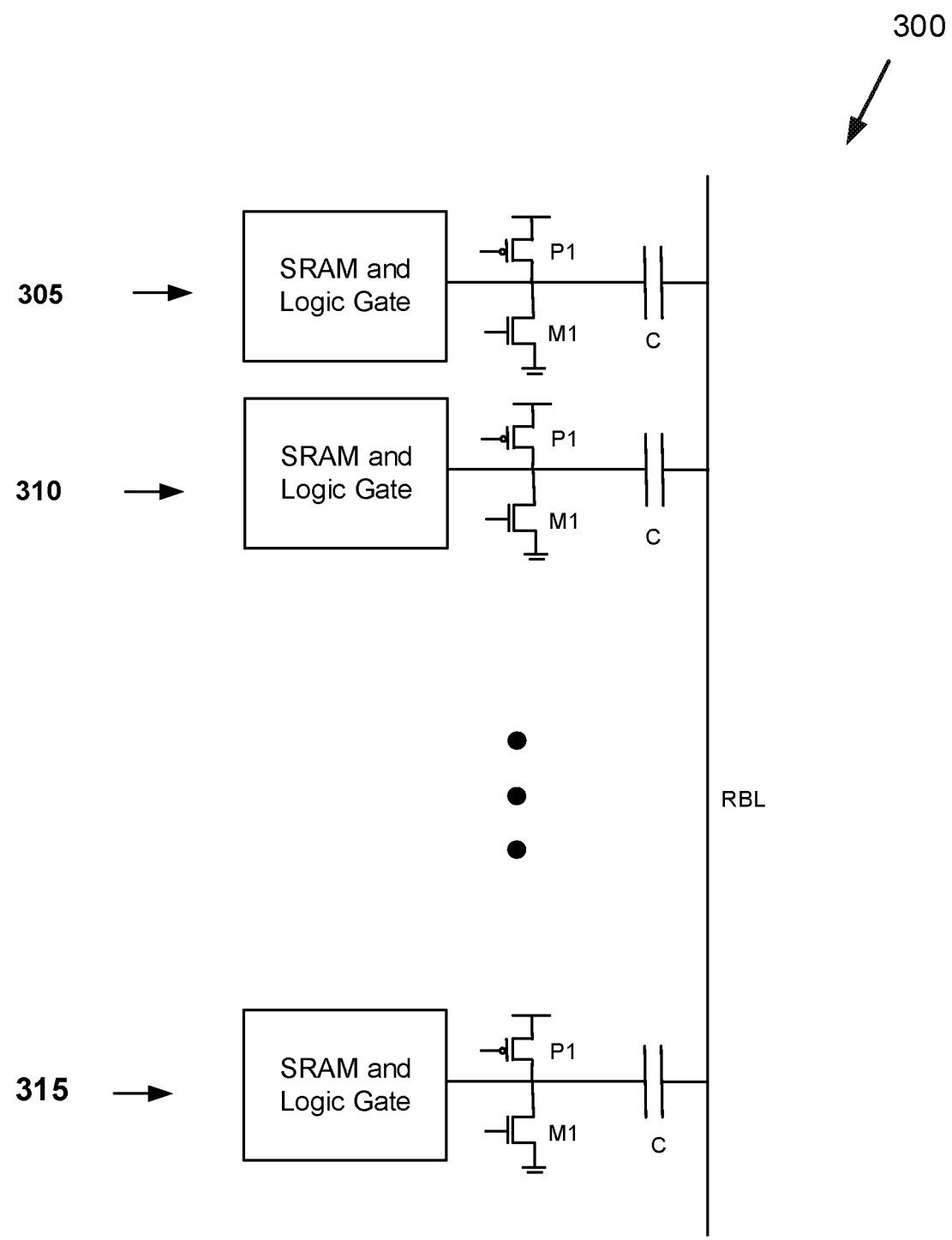
FIG. 3 illustrates a time-multiplexed group of CiM MAC circuits each having an integrated CDAC that provides a reference voltage to a common comparator in accordance with an aspect of the disclosure.

An example MAC circuit 300 that also functions as a CDAC is shown in FIG. 3 in more detail. MAC circuit/CDAC 300 includes a plurality of N CiM bitcells ranging from a first CiM bitcell 305, a second CiM bitcell 310, and so on to an Nth CiM bitcell 315. Since there are N CiM bitcells, MAC circuit 300 stores N binary filter weights that are multiplied by N input bits from an input vector. To store the binary filter weight and perform the multiplication, each CiM bitcell includes a static random access memory (SRAM) bitcell and a corresponding logic gate. Prior to the multiplication, an output capacitor C in each CiM bitcell is charged during a pre-charge phase by having a first plate charged to a power supply voltage VDD while a second plate is grounded through an n-type metal-oxide semiconductor (NMOS) transistor M1. The first plate for each output capacitor C connects to a read bit line (RBL) that is charged to the power supply voltage VDD during the pre-charge phase. The second plate for each output capacitor C connects to a drain of the CiM bitcell's transistor M1.

After the output capacitors C are charged, each transistor M1 is switched off during a computation phase in which each SRAM bitcell and logic gate performs its multiplication. This multiplication is a digital multiplication in that the second plate for the CiM bitcell's output capacitor C is either charged to the power supply voltage VDD or remains discharged. Since the read bit line remains charged to the power supply voltage VDD during the computation phase, the charging of the second plate causes the output capacitor C to be discharged. Conversely, the output capacitor C for a CiM bitcell remains charged if the second plate remains discharged from the multiplication.

An accumulation phase follows the calculation phase. During the accumulation phase, the read bit line floats while each bitcell's transistor M1 switches on. The resulting charges from all the output capacitors C is thus summed (accumulated) to form an output voltage for MAC circuit 300 on the read bit line RBL. This output voltage is then sampled by a sequential accumulator (not illustrated) that is then digitized during a digitization (CDAC) phase by an ADC that uses the output capacitors C as a CDAC. During the CDAC phase, the read bit line voltage is adjusted to equal the desired reference voltage that will drive a comparator 125 in the ADC analogously as discussed for comparator 125 for MAC circuit 200. To provide this adjustment the second plate of each output capacitor C may be grounded through the switching on of transistor M1. Conversely, the second plate of each output capacitor C may be charged to the power supply voltage VDD through a corresponding p-type metal-oxide semiconductor (PMOS) transistor P1 that has a drain connected to the second plate and a source connected to a power supply node for the power supply voltage VDD. A logic circuit such as FSM 115 (FIG. 2) would control each bitcell's transistors M1 and P1 in MAC circuit 300 during the CDAC phase. For example, if one-half the bitcells have their transistor P1 switched on (transistor M1 being off) and the other-half of the bitcells have their transistor M1 switched on (transistor P1 being off), then the resulting reference voltage on the read bit line would be VDD/2. In this fashion, by either increasing or decreasing the relative numbers of transistors M1 or P1 that are on during the CDAC phase, FSM 115 can boost or decrease the reference voltage on the read bit line as desired such as in the binary fashion discussed earlier.

Figure 4:
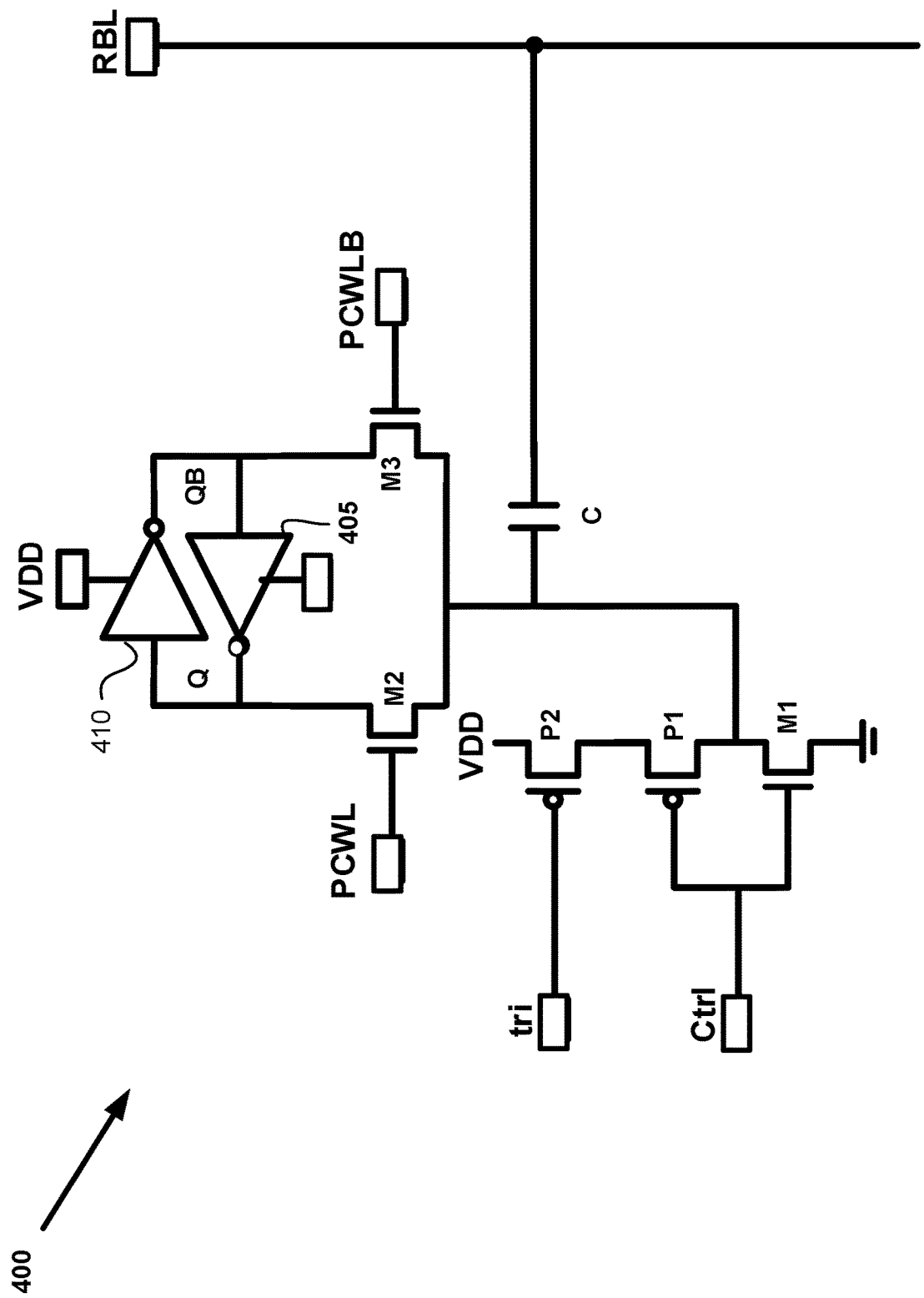
FIG. 4 illustrates a first CiM bitcell having a CDAC capability in accordance with an aspect of the disclosure.

There are assorted bitcell architectures that are suitable for MAC circuit 300 to provide a CDAC functionality for the output capacitors C. In these various bitcell architectures, the filter weight bit is stored by a pair of cross-coupled inverters but the remainder of the bitcell varies depending upon the implementation. For example, a bitcell 400 shown in FIG. 4 includes a pair of cross-coupled inverters 405 and 410 for storing the filter weight bit. In particular, the filter weight bit is stored on an output node Q of inverter 405B whereas the complement of the filter weight bit is stored on a complement output node QB of inverter 410. An NMOS transistor M2 has a source connected to the second plate of output capacitor C and a drain connected to the output node Q. Similarly, an NMOS transistor M3 has a source connected to the second plate of output capacitor C and a drain connected to the complement output node QB. The input bit controls a pre-charge word line (PCWL) that drives a gate of transistor M2 whereas a complement of the input bit controls a complement pre-charge word line (PCWLB) that drives a gate of transistor M3. In an active-high embodiment for the input bit, transistors M2 and M3 form an XNOR gate for XNORing the filter weight bit with the input bit. For example, if the input bit is true in an active-low embodiment while the filter weight bit is also true, transistor M2 will be on such that the second plate of the output capacitor is charged to the power supply voltage VDD during the calculation phase. Conversely, if the input bit is false in an active-high embodiment while the filter weight bit is also false, transistor M3 will be on such that the second plate of the output capacitor is charged to the power supply voltage VDD during the calculation phase. But if the input bit and the filter weight bit have complementary values, the second plate of the output capacitor remains discharged during the calculation phase. If, however, the input bit is active-low, transistors M2 and M3 form an XOR gate for the resulting multiplication of the input bit and the filter weight bit.

The second plate of the output capacitor C is discharged through transistor M1 or charged through transistor P1 as discussed previously. A control signal (ctrl) controls the gates of transistors M1 and P1. In bitcell 400, the source of transistor P1 couples to the power supply node through a PMOS transistor P2 that is controlled by a tri-state signal (tri) to provide a tri-state function to the second plate charging. Note that no bit lines are necessary to write the filter weight bit into bitcell 400 as transistors M1, M2, and M3 are used instead. For example, to write a binary one in an active-high embodiment, transistors M1 and M3 are switched on while transistor M2 is off. Conversely, transistors M1 and M2 are switched on while transistor M3 is off to write a binary zero into bitcell 400.

Figure 5:
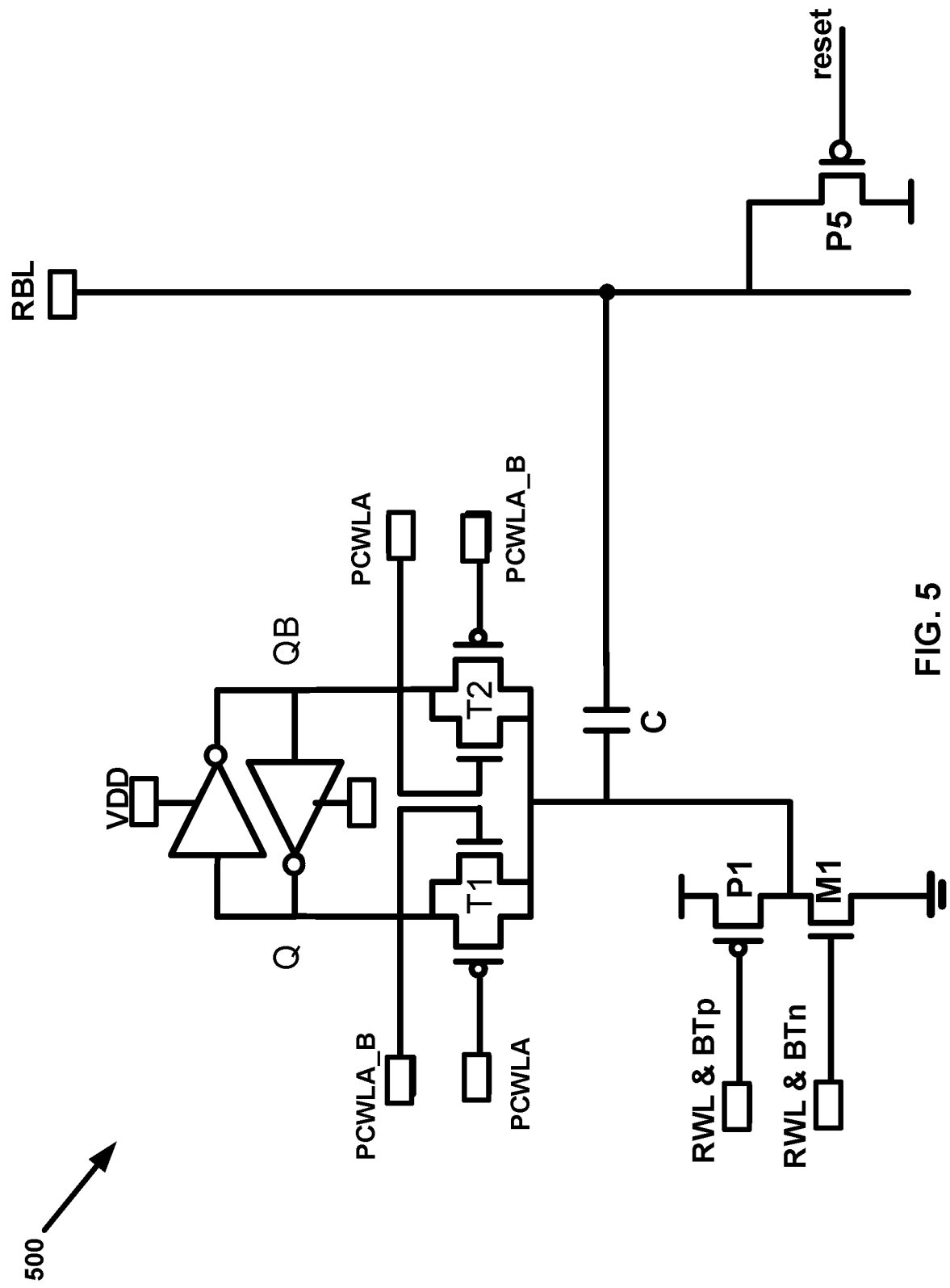
FIG. 5 illustrates a second CiM bitcell having a CDAC capability in accordance with an aspect of the disclosure.

The gating of the output node Q from the second plate of the output capacitor C may instead be performed by a transmission gate T1 as shown in FIG. 5 for a bitcell 500. The input bit controls a pre-charge word line PCWLA that drives a gate of a PMOS transistor in transmission gate T1. The complement of the input bit controls a complement pre-charge word line PCWLA_B that drives a gate of an NMOS transistor in transmission gate T1. A transmission gate T2 that controls whether the complement output node QB couples to the second plate of output capacitor C is analogous to transmission gate T1 except that it is the precharge word line PCWLA that controls the NMOS transistor on transmission gate T2. During the calculation phase in bitcell 500, a read word line (RWL) controls transistors M1 and P1. During the CDAC phase, a control signal BTp controls transistor P1 whereas a control signal BTn controls transistor M1. To control the pre-charging of the read bit line, a PMOS transistor P5 has a source connected to the power supply node and a drain connected to the read bit line. An active-low reset signal (reset) drives the gate of transistor P5 to control whether the read bit line floats or is charged to the power supply voltage VDD.

Figure 6:
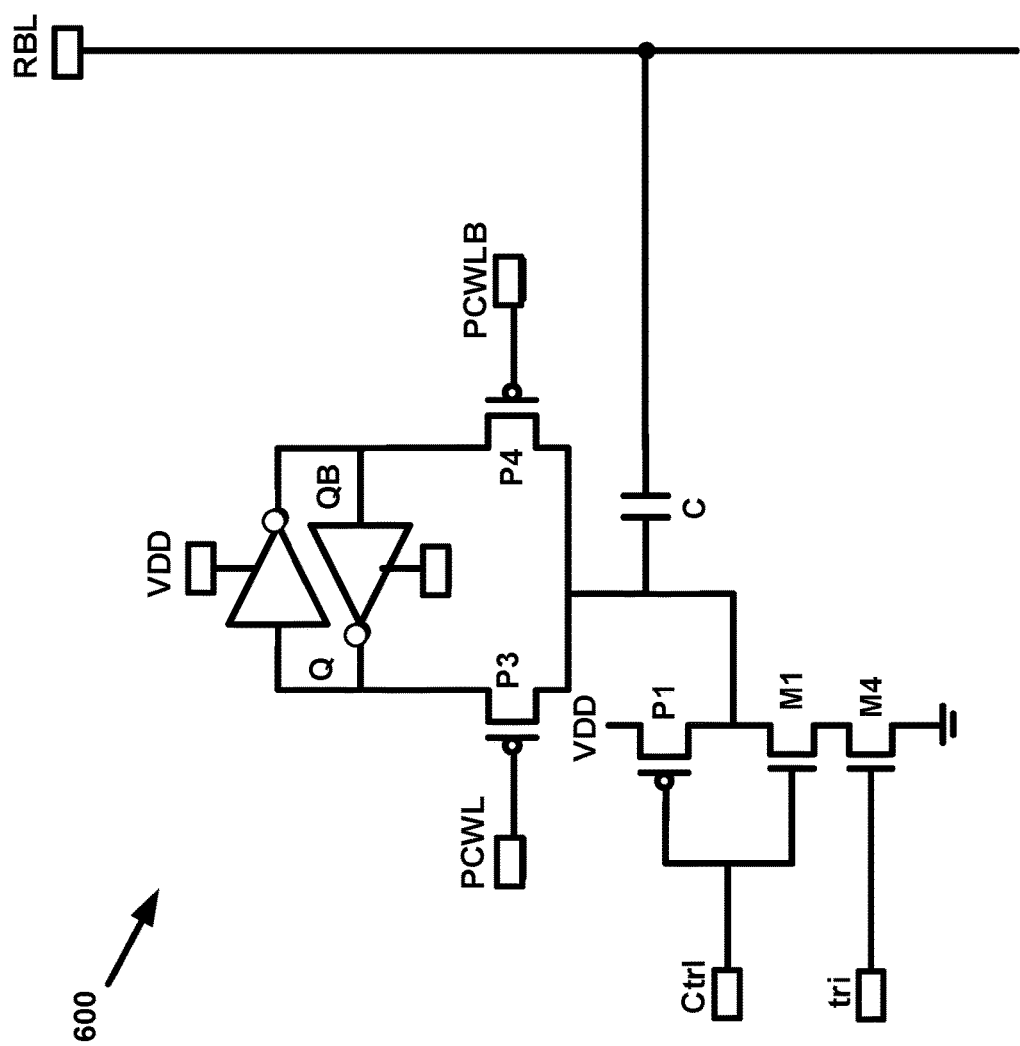
FIG. 6 illustrates a third CiM bitcell having a CDAC capability in accordance with an aspect of the disclosure.

A bitcell 600 shown in FIG. 6 is analogous to bitcell 400 but transistor M2 is replaced by a PMOS transistor P3. The pre-charge word line PCWL drives the gate of transistor P3. Similarly, transistor M3 is replaced by a PMOS transistor P4 having a gate driven by the complement pre-charge word line PCWLB. In such a PMOS implementation for the gating of the output node Q and the complement output node QB from the second plate of the output capacitor C, the tri-state function is performed by an NMOS transistor M4 that has a source connected to ground and a drain connected to a source of transistor M1. The tri-state signal (tri) drives the gate of transistor M4. During the calculation phase, transistors M1 and P1 are controlled by a read word line (not illustrated) as discussed for bitcell 500. During the CDAC phase, a control signal ctrl controls transistors M1 and P1.

Figure 7:
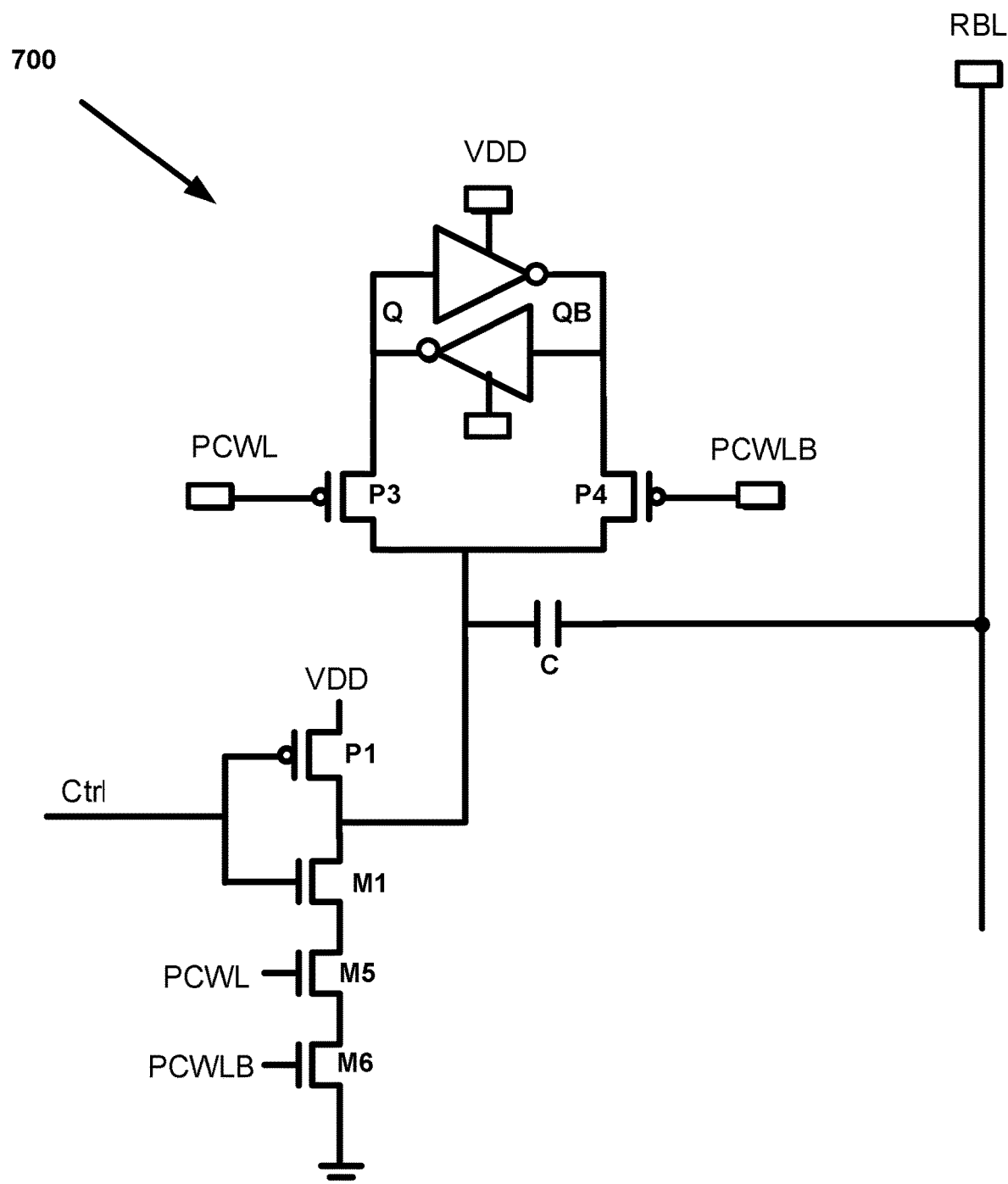
FIG. 7 illustrates a fourth CiM bitcell having a CDAC capability in accordance with an aspect of the disclosure.

Bitcell 600 may be modified to eliminate the tri-state signal as shown for a bitcell 700 of FIG. 7. Transistor M4 is replaced by an NMOS transistor M5 and an MMOS transistor M6. The source of transistor M6 connects to ground. A drain of transistor M6 connects to a source of transistor M5 that in turn has a drain connected to a source of transistor M1. The pre-charge word line PCWL drives the gate of transistor M5 whereas the complement pre-charge word line PCWLB drives the gate of transistor M6. During a tri-state condition, one or both of the pre-charge word line PCWL and the complement pre-charge word line PCWL is discharged to float the second plate of the output capacitor C. During the calculation phase, both of the pre-charge word lines are asserted so that the second plate of the output capacitor C can be grounded through transistors M1, M5, and M6. The control signal ctrl controls transistors P1 and M1 during the CDAC phase. The same serial combination of transistors P1, M1, M5, and M6 may replace the serial combination of transistors P2, P1, and M1 in bitcell 400 to eliminate the need for its tri-state signal.

Although numerous bitcell architectures may thus be used, note that they all include transistors M1 and P1 so that the second plate of the output capacitor may be selectively charged or discharged as needed during the CDAC phase. An array of CiM bitcells may thus be arranged such as by columns to form MAC circuits in which the bitcells each have an output capacitor C that may be used as a CDAC capacitor during the CDAC phase. Each MAC circuit may have its own comparator 125 and FSM 115 as discussed with regard to FIG. 2. But note that a layer may require a substantial number of neurons (e.g., 128 or more). The implementation of so many independent ADCs (one for each MAC circuit/neuron) is challenging. To ease the implementation, an ADC embodiment is disclosed herein in which the comparator and the FSM (or other suitable logic circuit for controlling the CDAC) are shared across a plurality of MAC circuits. The following discussion will assume that each MAC circuit is formed by a column of CiM bitcells as discussed with regard to MAC circuit 300. Each CiM bitcell may be implemented such as discussed for bitcells 400, 500, 600, 700. Other bitcell embodiments may also be used as will be described further herein.

Figure 8:
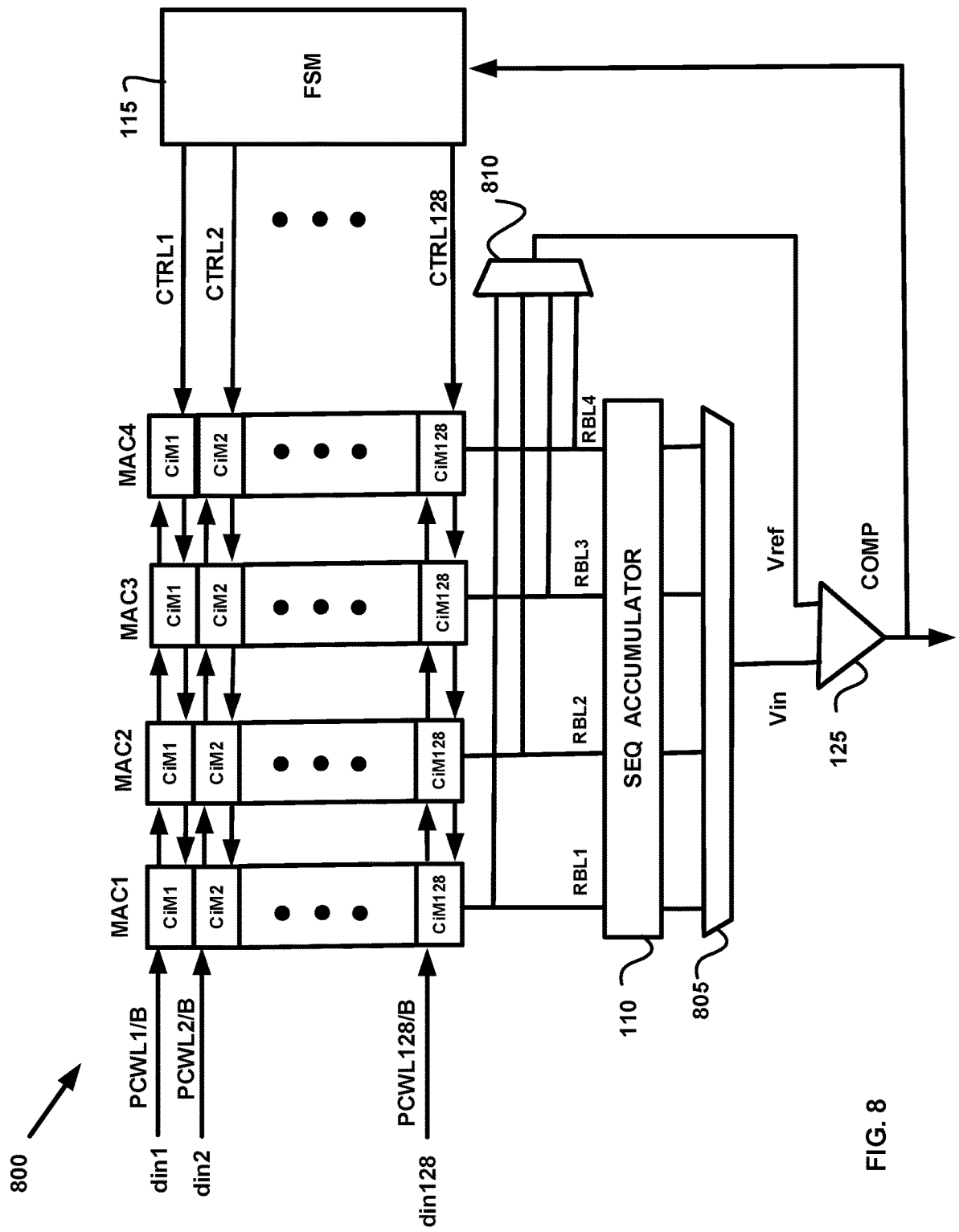
FIG. 8 illustrates a time-multiplexed group of CiM MAC circuits each having an integrated CDAC that provides a reference voltage to a common comparator in accordance with an aspect of the disclosure.

To simplify the ADC implementation, a time-multiplexed group of MAC circuits 800 shown in FIG. 8 includes a first MAC circuit (MAC1), a second MAC circuit (MAC2), a third MAC circuit (MAC3), and a fourth MAC circuit (MAC4) that share a common comparator 125 and an FSM 115. The number of MAC circuits within a time-multiplexed group may be greater than or less than four in alternative embodiments. Each MAC circuit includes a plurality of CiM bitcells such as discussed earlier in which the output capacitor C for each CiM bitcell is also a CDAC capacitor for a CDAC phase following the multiplication and accumulation phases. Each MAC circuit can thus provide the reference voltage that is adjusted as necessary by FSM 115 during the digitization of the final MAC output voltage as discussed with regard to MAC circuit 200 of FIG. 2. The number of CiM bitcells in each MAC circuit depends upon the number of input bits. In this example, the number of input bits is 128 so that the input bits range from a first input bit din1 to a 128th input bit din128. Note that each input bit may be part of a multi-bit input sample. For example, suppose that the input samples are three-bit samples. There would thus be three sets of 128 input bits corresponding to this three-bit width. In a first calculation cycle, the input bits may be the least-significant bits (LSBs) of the three-bit input samples. In a second calculation cycle, the input bits would then be the next-to-most-significant bits (NSMBs) of the three-bit input samples. In a third calculation cycle, the input bits would then be the most-significant bits (MSBs) of the three-bit input samples.

Each MAC circuit is time multiplexed so that the first MAC circuit calculates based on the input bit sets, then the second MAC circuit, and so on. For example, the first MAC circuit drives a first read bit line voltage on a first read bit line (RBL1) in response to the LSB set of inputs. Sequential accumulator 110 samples one-half of the first read bit line voltage. This first sampled voltage may be designated the LSB/2 voltage since it comes from the LSB set of inputs. The first MAC circuit can again drive the first read bit line voltage with an accumulated voltage from the multiplication of its stored filter weight bits with the second set of input bits (the NMSB set of inputs). This accumulated voltage may thus be designated as the NMSB voltage. To provide the proper binary accumulation, sequential accumulator 110 accumulate one-half of NMSB voltage with one-half of the LSB/2 voltage to provide an accumulated result equaling one-half the NMSB voltage and one-fourth of the LSB voltage. In the third calculation cycle, the first MAC circuit drives the first read bit line with an accumulated voltage (the MSB voltage) from the multiplication of the MSB set of inputs with its stored filter weights. Sequential accumulator 110 then samples one-half of the MSB voltage summed with the sequential accumulation voltage from the previous cycle to provide a final MAC output voltage of MSB/2+NMSB/4+LSB/8. The various bits to the input samples are thus given their proper weight by sequential accumulator 110. A multiplexer 805 selects for this final MAC output voltage (Vin) for the first MAC circuit to drive comparator 125 accordingly. The output capacitors C (not illustrated) in the CiM bitcells in the first MAC circuit may then be repurposed to form the appropriate reference voltage (Vref) as controlled by FSM 115. A multiplexer 810 selects for this reference voltage to provide the reference voltage to comparator 125.

After the final MAC output voltage from the first MAC circuit has been digitized, the process repeats with the second MAC circuit, then the third MAC circuit, and finally with the fourth MAC circuit. Multiplexer 805 and 810 are controlled by FSM 115 to select for the appropriate accumulation result and read bit line voltage, respectively, depending upon which MAC circuit is being processed. Since each MAC circuit has the same number of CiM bitcells, the CiM bitcells are arranged in rows according to their order within each column. For example, a first CiM bitcell in each MAC circuit forms a first row of CiM bitcells, a second CiM bitcell in each MAC circuit forms a second row of CiM bicells, and so on such that a final CiM bitcell (in this embodiment, the 128th CiM bitcell) forms a final row of CiM bitcells. Each row of CiM bitcells shares the corresponding pre-charge word line (PCWL) and the corresponding complement pre-charge word line. For example, there is a PCWL1 for the first row, a PCWL2 for the second row, and so on. Each row of CiM bitcells also shares the control signal (ctrl) for controlling transistor M1 and P1 during the CDAC phase discussed with regard to CiM bitcells 400, 500, 600, and 700. There is thus a first control signal (CTRL1) for the first row, a second control signal (CTRL2) for the second row, and so on. But since all the final MAC output voltages are digitized by a common comparator 125 and FSM 115, the resulting ADC operation is greatly simplified as compared to each MAC circuit having its own independent ADC. Should the filter weights themselves be multi-bit filter weights, each MAC circuit may correspond to a filter weight bit. For example, if the filter weights are four-bit filter weights, then the first MAC circuit may store the LSB filter weight bits. The remaining MAC circuits would correspond to successively higher-order filter weight bits such that the fourth MAC circuit may store the filter weight MSBs, the third MAC circuit may store the next-to-most-significant filter weight bits, and the second MAC circuit may store the next-to-next-to-most-significant filter weight bits. Sequential accumulator 110 would then not only accumulate across the input weight bits but also across the filter weight bits according to their significance.

Figure 9A:
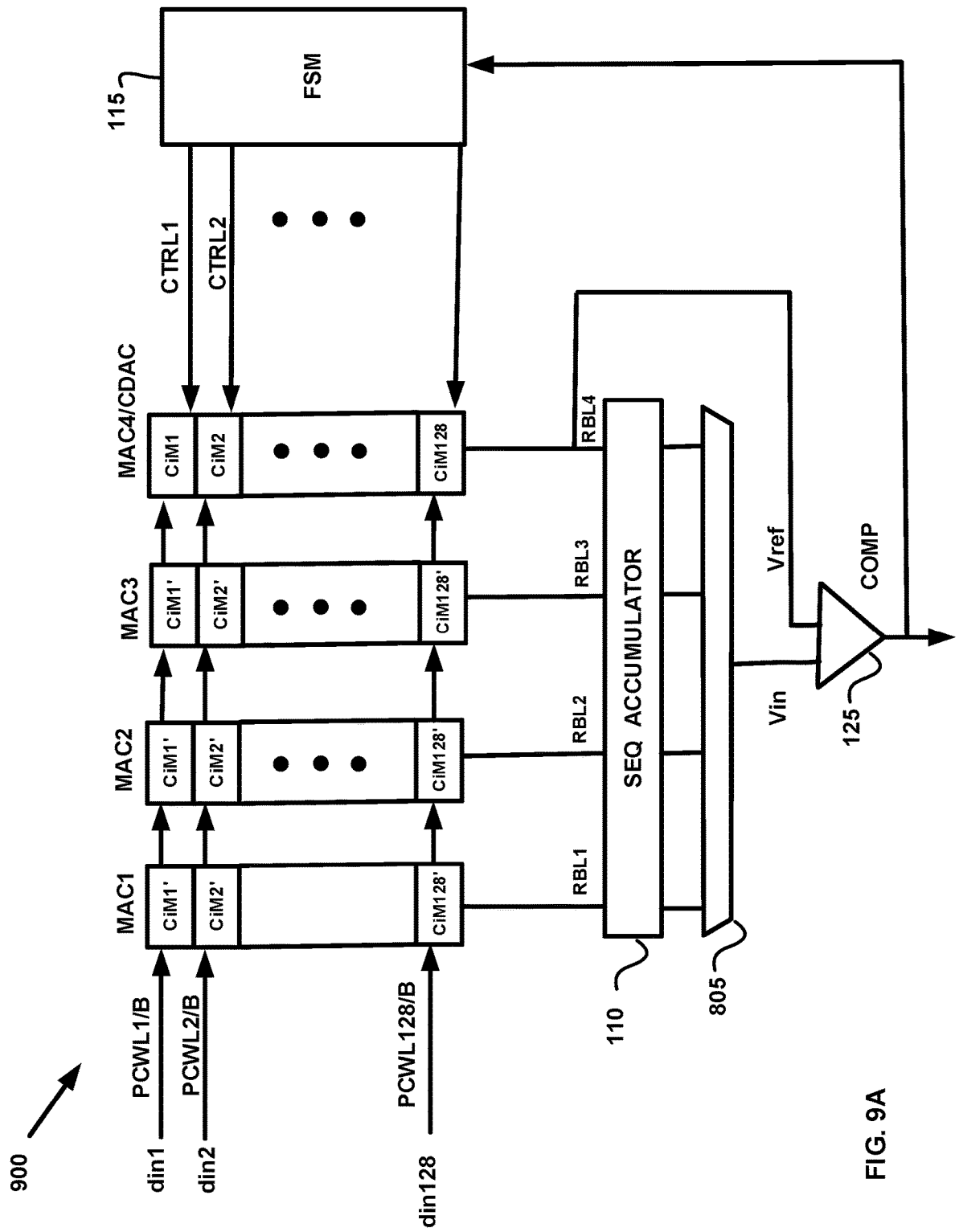
FIG. 9A illustrates a time-multiplexed group of CiM MAC circuits in which only one of the CiM MAC circuits has an integrated CDAC that provides a reference voltage to a common comparator in accordance with an aspect of the disclosure.

Since the various MAC circuits are time sharing a comparator 125 and a FSM 115, only one of the MAC circuits needs to have a CDAC capability. For example, FIG. 9A illustrates a time-multiplexed group 900 MAC circuits in which only a fourth MAC circuit (MAC4/CDAC) has a CDAC capability. In this embodiment, there is a first MAC circuit (MAC1), a second MAC circuit (MAC2), and a third MAC circuit (MAC3) that do not have CDAC capability, but it will be appreciated that the number of such CDAC-less MAC circuits may be less than or greater than three in alternative embodiments. The time multiplexed operation of the MAC circuits in group 900 is similar to the time-multiplexed operation of group 800 except that it is only the fourth MAC circuit that can produce the reference voltage (Vref) during the digitization of the final MAC output voltage from sequential accumulator 110. Depending upon which MAC circuit is operative, multiplexer 805 selects for the final MAC output voltage accordingly as discussed for group 800. But the control signals from FSM 115 in group 900 only control the transistors M1 and P1 in the CiM bitcells in the fourth MAC circuit. There is thus no routing of these control signals to the CiM bitcells in the first, second, and third MAC circuits. Since the CiM bitcells in these other MAC circuits do not have a CDAC capability, they are designated with a' symbol. For example, the CiM bitcells in the first MAC circuit range from a first CiM bitcell (CiM1') to a final CiM bitcell (CiM128'). The arrangement of the CiM bitcells in the second and third MAC circuits is analogous. In contrast, the CiM bitcells in the fourth MAC circuit have a CDAC capability and thus include both the M1 and the P1 transistors as discussed for bitcells 400, 500, 600, and 700. To distinguish these CDAC-capable CiM bitcells, the CiM bitcells in the fourth MAC circuit are not designated with the ' symbol.

Figure 9B:
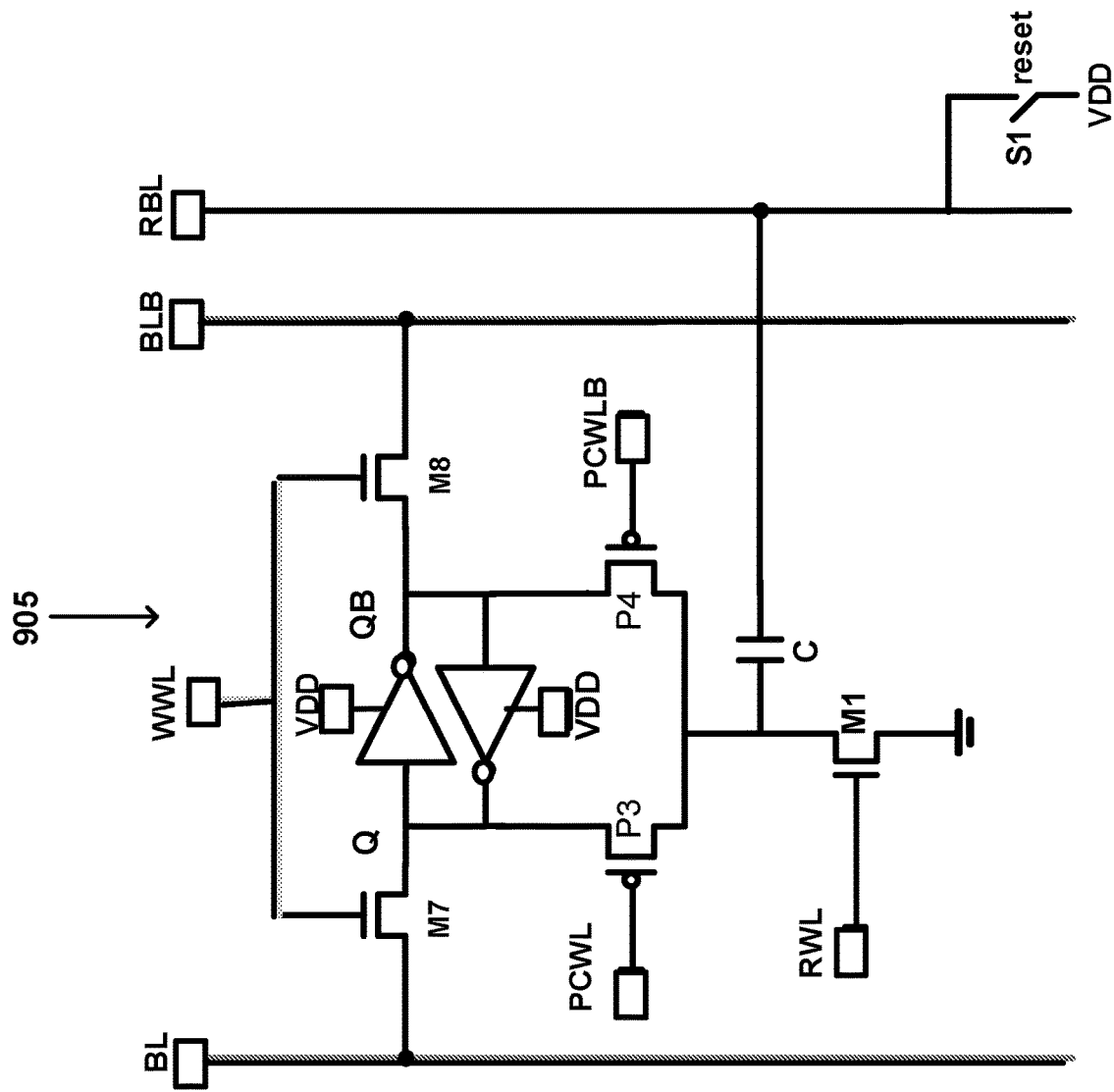
FIG. 9B illustrates a CiM bitcell for the MAC circuits in the time-multiplexed group of FIG. 9A that do not have an integrated CDAC in accordance with an aspect of the disclosure.

In group 900, the pre-charge bit word line and the complement pre-charge word lines are arranged by rows as discussed for group 800. For example, a first pre-charge word line (PCWL1) and a complement pre-charge word line (PCWL1B) extend across the CiM1' bitcells in the first, second, and third MAC circuits to couple to the CiM1 bitcell in the fourth MAC circuits. An example CiM' bitcell 905 without CDAC capability is shown in FIG. 9B. CiM' bitcell 905 is a PMOS-gated embodiment analogous to bitcell 600. Transistor P3 thus couples the Q output node to the second plate of the output capacitor C depending upon the value of the corresponding input bit. Similarly, transistor P4 couples the complement QB output node to the second plate of the output capacitor C depending upon the value of the corresponding complement input bit. It will be appreciated, however, that transistors P3 and P4 may be replaced by transmission gates T1 and T2 analogously as discussed for CiM bitcell 500 or by transistors M2 and M3 analogously as discussed for CiM bitcell 400. But note that there is no transistor P1 in CiM' bitcell 905. Instead, CiM' bitcell 905 has only the transistor M1 that connects between ground and the second plate of the output capacitor. In bitcell 905, the write operation for the filter weight bit is performed using a bit line (BL) and a complement bit line (BLB) as is conventional in the SRAM arts. During the write operation, a write word line (WWL) is asserted to switch on an NMOS access transistor M7 to couple the bit line BL to the Q output node. Similarly, the assertion of the write word line switches on an NMOS access transistor M8 to couple the complement QB output node to the complement bit line BLB. It will be appreciated, however, that in alternative embodiments, CiM' bitcell 905 may be written to through transistor M1 and one of transistors P3 or P4 as discussed analogously with regard to CiM bitcell 600. In CiM bitcell 905, the read bit line RBL is pre-charged through a switch Si controlled by the reset signal.

Figure 10:
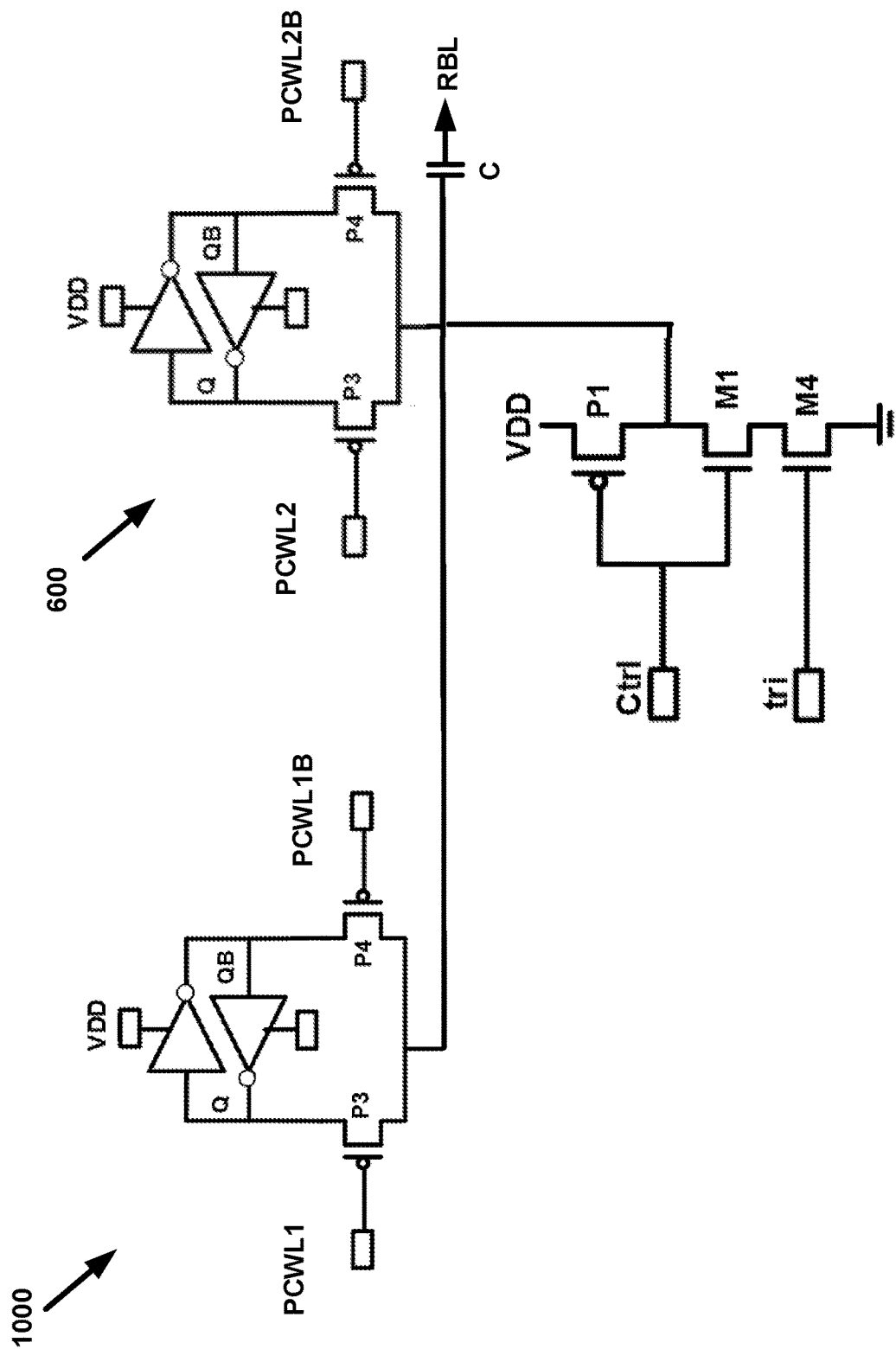
FIG. 10 illustrates a first CiM bitcell and a second CiM bitcell in which only the second CiM bitcell has an output capacitor and a CDAC capability in accordance with an aspect of the disclosure.

Note each row of bitcells in a time-multiplexed group of MAC circuits may share a common output capacitor. For example, just one MAC circuit may include CDAC-capable CiM bitcells. The remaining MAC circuits would then have CiM bitcells that do not include an output capacitor C. Such output-capacitor-less CiM bitcells are designated with two ' symbols in the following discussion. An example CiM" bitcell 1000 that time-shares an output capacitor in a CiM bitcell 1005 is shown in FIG. 10. CiM" bitcell 1000 is analogous to bitcell 600 except that it is missing the output capacitor C as well as transistors P1, M1, and M4. CiM bitcell 1005 is arranged as discussed for CiM bitcell 600. Note that transistors P3 and P4 in CiM" bitcell 1000 and in CiM bitcell 1005 may be replaced by transistors M2 and M3 or transmission gates T1 and T2 in alternative embodiments. CiM" bitcell 1000 and CiM bitcell 1005 are in different MAC circuits but in the same row. Note that it arbitrary how many CiM"-bitcell-containing MAC circuits that may be integrated into the same time-multiplexed group that share output capacitors C. Since each row in the MAC circuits share an output capacitor C, each bitcell within a row of a time-multiplexed group of MAC circuits has its own pre-charge word lines. For example, transistors P3 and P4 in CiM" bitcell 1000 are controlled by a first pre-charge word line PCWL1 and its complement PCWL1B whereas the same transistors in CiM bitcell 1005 are controlled by a second pre-charge word line PCWL2 and its complement PCWL2B. During the time-multiplexed operation, the MAC circuit including CiM" bitcell 1000 calculates its result so that its read bit line (not illustrated) can be charged with the resulting accumulated voltage. But this calculation uses the output capacitor and the P1, M1, and M4 transistors in the MAC circuit including CiM bitcell 1005. Each MAC circuit having CiM" bitcells would also have their successive calculation operation. Similarly, the MAC circuit having the CiM bitcells has its own time-shared or multiplexed operation.

Figure 11:
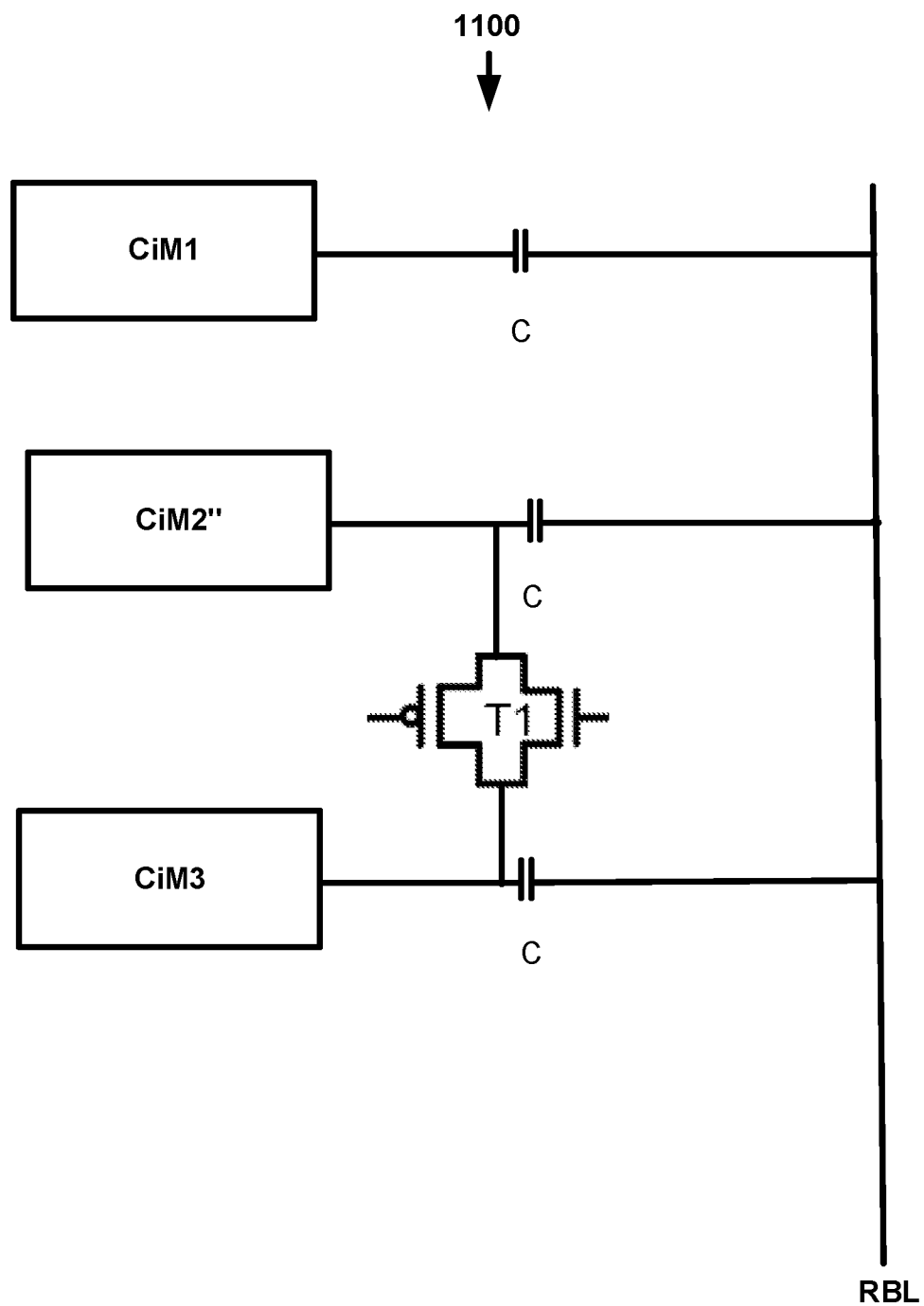
FIG. 11 illustrates a CiM MAC circuit in which the CiM bitcells have their output capacitors coupled together through transmission gates in accordance with an aspect of the disclosure.

Note that the MAC circuit with the CDAC capability may be further simplified as shown in FIG. 11 for a MAC circuit 1100. As discussed previously, during the CDAC phase, the reference voltage is changed in a successively binary fashion (e.g., increased from ½ VDD to ¾ VDD or decreased from ½ VDD to ¼ VDD and so on). To make such successive changes in the reference voltage, groups of the output capacitors C are switched (either transistor M1 or transistor P1 being switched on to either ground or charge the second plate of the output capacitor C, respectively) according to the desired change in the reference voltage: one output capacitor C, two output capacitors C, four output capacitors C, eight output capacitors C, etc. Each group of output capacitors C needs only one transistor M1 and transistor P1 to ground (or charge) the second plates in the group. For example, a first CiM bitcell (CiM1) includes a CDAC capability (includes an M1 and P1 transistor as discussed for bitcells 400, 500, 600, and 700). A group of two bitcells formed be a CiM" bitcell (CiM2") and a CDAC-capable CiM bitcell (CiM3) have their second plates coupled through a transmission gate T1. During a CDAC phase for MAC circuit 1100, if a 2C change is necessary in the reference voltage being developed on the read bit line (RBL), transmission gate T1 is closed (e.g., by the FSM in the ADC, not illustrated) so that the second plates in the 2C group can be charged or discharged as desired. It will be appreciated that MAC circuit 1100 could also contain a 4C group that would have their second plates coupled together through corresponding transmission gates, an 8C group, and so on.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A system for a machine learning application, comprising:
    a first multiply-and-accumulate (MAC) circuit including a first plurality of compute-in-memory bitcells configured to multiply a first plurality of stored weights with an input vector to provide a series of first MAC output voltages during a first calculation phase, the first MAC circuit also being configured to provide a first reference voltage during a first capacitive-digital-to-analog converter (CDAC) phase;
    a second MAC circuit including a second plurality of compute-in-memory bitcells configured to multiply a second plurality of stored weights with the input vector to provide a series of second MAC output voltages during a second calculation phase, the second MAC circuit also being configured to provide a second reference voltage during a second CDAC phase;
    a sequential accumulator configured to accumulate the series of first MAC output voltages to provide a first final MAC output voltage and to accumulate the series of second MAC output voltages to provide a second final MAC output voltage;
    a first multiplexer configured to select between the first final MAC output voltage and the second final MAC output voltage to provide a selected output voltage; and
    a comparator configured to compare the selected output voltage to the first reference voltage during the first CDAC phase and to compare the selected output voltage to the second reference voltage during the second CDAC phase to provide a digital output for the system.

2. The system of claim 1, further comprising:
    a logic circuit configured to control the first MAC circuit to vary the first reference voltage during the first CDAC phase and to vary the second reference voltage during the second CDAC phase.

3. The system of claim 2, wherein the logic circuit is a finite state machine.

4. The system of claim 2, wherein each compute-in-memory bitcell in the first plurality of compute-in-memory bitcells and in the second plurality of compute-in-memory bitcells includes:
    a first inverter configured to drive a true output node responsive to a filter weight bit;
    a second inverter configured to drive a complement output node responsive to a complement of the filter weight bit;
    an output capacitor having a first plate and a second plate;
    a first switch connected between the second plate and the true output node, the first switch being responsive to a first input bit;
    a second switch connected between the second plate and the complement output node, the second switch being responsive to a complement of the first input bit;
    a first transistor connected between the second plate and ground; and
    a second transistor connected between the second plate and a power supply node for a power supply voltage.

5. The system of claim 4, wherein the logic circuit is configured to control the first transistor and the second transistor in each compute-in-memory bitcell.

6. The system of claim 4, wherein each first transistor is an n-type metal-oxide semiconductor (NMOS) transistor.

7. The system of claim 4, each second transistor is an p-type metal-oxide semiconductor (PMOS) transistor.

8. The system of claim 4, further comprising:
    a first read bit line, wherein the first plate of the output capacitor in each compute-in-memory bitcell in the first plurality of compute-in-memory bitcells is connected to the first read bit line; and
    a second read bit line, wherein the first plate of the output capacitor in each compute-in-memory bitcell in the second plurality of compute-in-memory bitcells is connected to the second read bit line.

9. The system of claim 1, further comprising:
    a third MAC circuit including a third plurality of compute-in-memory bitcells configured to multiply a third plurality of stored weights with the input vector to provide a series of third MAC output voltages during a third calculation phase, the third MAC circuit also being configured to provide a third reference voltage during a third CDAC phase.

10. The system of claim 9, further comprising:
    a fourth MAC circuit including a fourth plurality of compute-in-memory bitcells configured to multiply a fourth plurality of stored weights with the input vector to provide a series of fourth MAC output voltages during a fourth calculation phase, the fourth MAC circuit also being configured to provide a fourth reference voltage during a fourth CDAC phase.

11. A system for a machine learning application, comprising:
    a first multiply-and-accumulate (MAC) circuit including a first plurality of compute-in-memory bitcells configured to multiply a first plurality of stored weights with an input vector to provide a series of first MAC output voltages during a first calculation phase;
a second MAC circuit including a second plurality of compute-in-memory bitcells configured to multiply a second plurality of stored weights with the input vector to provide a series of second MAC output voltages during a second calculation phase, the second MAC circuit also being configured to provide a reference voltage during a first CDAC phase for the first MAC circuit and during a second CDAC phase for the second MAC circuit;
a sequential accumulator configured to accumulate the series of first MAC output voltages to provide a first final MAC output voltage and to accumulate the series of second MAC output voltages to provide a second final MAC output voltage;
a first multiplexer configured to select between the first final MAC output voltage and the second final MAC output voltage to provide a selected output voltage; and
a comparator configured to compare the selected output voltage to the reference voltage during the first CDAC phase and to compare the selected output voltage to the reference voltage during the second CDAC phase to provide a digital output for the system.

12. The system of claim 11, further comprising:
a logic circuit configured to control the second MAC circuit to vary the reference voltage during the first CDAC phase and during the second CDAC phase.

13. The system of claim 12, wherein the logic circuit is a finite state machine.

14. The system of claim 12, wherein each compute-in-memory bitcell in the second plurality of compute-in-memory bitcells includes:
a first inverter configured to drive a true output node responsive to a filter weight bit;
a second inverter configured to drive a complement output node responsive to a complement of the filter weight bit;
an output capacitor having a first plate and a second plate;
a first switch connected between the second plate and the true output node, the first switch being responsive to a first input bit;
a second switch connected between the second plate and the complement output node, the second switch being responsive to a complement of the first input bit;
a first transistor connected between the second plate and ground; and
a second transistor connected between the second plate and a power supply node for a power supply voltage.

15. The system of claim 14, wherein the logic circuit is configured to control the first transistor and the second transistor in each compute-in-memory bitcell in the second plurality of compute-in-memory bitcells.

16. The system of claim 14, wherein each first transistor is an n-type metal-oxide semiconductor (NMOS) transistor.

17. The system of claim 14, wherein each second transistor is an p-type metal-oxide semiconductor (PMOS) transistor.

18. The system of claim 14, further comprising:
a first read bit line, wherein a first plate of the output capacitor in each compute-in-memory bitcell in the first plurality of compute-in-memory bitcells is connected to the first read bit line; and
a second read bit line, wherein the first plate of the output capacitor in each compute-in-memory bitcell in the second plurality of compute-in-memory bitcells is connected to the second read bit line.

19. The system of claim 11, further comprising:
a third MAC circuit including a third plurality of compute-in-memory bitcells configured to multiply a third plurality of stored weights with the input vector to provide a series of third MAC output voltages during a third calculation phase.

20. The system of claim 19, further comprising:
a fourth MAC circuit including a fourth plurality of compute-in-memory bitcells configured to multiply a fourth plurality of stored weights with the input vector to provide a series of fourth MAC output voltages during a fourth calculation phase.

21. A system for a machine learning application, comprising:
a read bit line;
a first compute-in-memory bitcell having a first output node; and
a second compute-in-memory bitcell including:
a second output node;
an output capacitor having a first plate connected to the first output node and the second output node and having a second plate connected to the read bit line;
a first transistor connected between the second plate and ground; and
a second transistor connected between the second plate and a power supply node for a power supply voltage.

22. The system of claim 21, wherein the first compute-in-memory bitcell and the second compute-in-memory bitcell are arranged in a row, the system further comprising:
a first multiply-and-accumulate (MAC) circuit including a first plurality of compute-in-memory bitcells configured to multiply a first plurality of stored weights with an input vector to provide a series of first MAC output voltages during a first calculation phase, the first plurality of compute-in-memory bitcells including the first compute-in-memory bitcell; and
a second MAC circuit including a second plurality of compute-in-memory bitcells configured to multiply a second plurality of stored weights with the input vector to provide a series of second MAC output voltages during a second calculation phase, the second MAC circuit also being configured to provide a reference voltage during a first CDAC phase for the first MAC circuit and during a second CDAC phase for the second MAC circuit, wherein the second plurality of compute-in-memory bitcells includes the second compute-in-memory bitcell.

23. The system of claim 22, further comprising:
a logic circuit configured to control the second MAC circuit to vary the reference voltage during the first CDAC phase and during the second CDAC phase.

24. The system of claim 23, wherein the logic circuit is a finite state machine.

25. The system of claim 24, wherein the first transistor is an n-type metal-oxide semiconductor (NMOS) transistor and the second transistor is an p-type metal-oxide semiconductor (PMOS) transistor.

26. A multiply-and-accumulate (MAC) circuit for a machine learning application including:
a read bit line;
a first compute-in-memory bitcell including a first output capacitor having a first plate connected to the read bit line and having a second plate;
a second compute-in-memory bitcell including a second output capacitor having a first plate connected to the read bit line and having a second plate; and a transmission gate connected between the second plate of the first output capacitor and the second plate of the second output capacitor.

27. The MAC circuit of claim 26, wherein the second compute-in-memory bitcell includes:
   a first transistor connected between ground and the second plate of the second output capacitor; and
   a second transistor connected between a power supply node for a power supply voltage and the second plate of the second output capacitor.

28. The MAC circuit of claim 27, wherein the first transistor is an n-type metal-oxide semiconductor (NMOS) transistor.

29. The MAC circuit of claim 27, wherein the second transistor is an p-type metal-oxide semiconductor (PMOS) transistor.

* * * * *